US007061773B2

(12) United States Patent
Chen

(10) Patent No.: US 7,061,773 B2
(45) Date of Patent: Jun. 13, 2006

(54) ELECTRONIC APPARATUS AND SHIELDING MODULE THEREOF

(75) Inventor: Yi-Jen Chen, Lujhou (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 10/945,968

(22) Filed: Sep. 22, 2004

(65) Prior Publication Data

US 2005/0141211 A1   Jun. 30, 2005

(30) Foreign Application Priority Data

Dec. 30, 2003   (TW) ............................. 92137510 A

(51) Int. Cl.
   *H05K 9/00*    (2006.01)
(52) U.S. Cl. ...................... 361/816; 361/818; 361/800; 361/810; 361/803
(58) Field of Classification Search ................ 361/760, 361/720, 686–688, 696–697, 701–703, 816, 361/818, 800, 803, 810
See application file for complete search history.

(56) References Cited

U.S. PATENT DOCUMENTS

| 5,129,833 | A | * | 7/1992 | Rowlette, Sr. ............... 439/91 |
| 5,241,453 | A | * | 8/1993 | Bright et al. ............... 361/704 |
| 5,548,481 | A | * | 8/1996 | Salisbury et al. ........... 361/709 |
| 5,895,884 | A | * | 4/1999 | Davidson ................... 174/35 R |
| 6,025,991 | A | * | 2/2000 | Saito .......................... 361/704 |
| 6,034,874 | A | * | 3/2000 | Watanabe ................... 361/704 |
| 6,061,235 | A | * | 5/2000 | Cromwell et al. .......... 361/690 |
| 6,084,178 | A | * | 7/2000 | Cromwell .................. 174/35 R |
| 6,545,871 | B1 | * | 4/2003 | Ramspacher et al. ....... 361/709 |
| 6,673,998 | B1 | * | 1/2004 | Wu ........................ 174/35 GC |
| 6,693,798 | B1 | * | 2/2004 | Conn et al. .................. 361/754 |
| 2004/0125567 | A1 | * | 7/2004 | Lee et al. .................... 361/707 |

FOREIGN PATENT DOCUMENTS

TW              540997          10/2002

* cited by examiner

*Primary Examiner*—Kamand Cuneo
*Assistant Examiner*—Hung S. Bui
(74) *Attorney, Agent, or Firm*—Birch Stewart Kolasch & Birch LLP

(57) ABSTRACT

A shielding module is used for shielding an electrical device. In this case, the shielding module includes a heat-dissipating component, a casing and a connection component. The heat-dissipating component has a contacting portion to contact with the electrical device. The electrical device is located in the casing, which has an opening. The heat-dissipating component is disposed in the opening. The connection component and the casing fasten the heat-dissipating component on the electrical device. Furthermore, an electrical apparatus is provided and includes an electrical device, a heat-dissipating component, a casing, and a connection component. In this case, the electrical device is fastened on a circuit board. The heat-dissipating component has a contacting portion adjacent to the electrical device. The electrical device is disposed in the casing, which has an opening. The heat-dissipating component is disposed in the opening. The connection component and the casing fasten the heat-dissipating component on the electrical device.

14 Claims, 5 Drawing Sheets

ELECTRONIC APPARATUS AND SHIELDING MODULE THEREOF

This Non-provisional application claims priority under 35 U.S.C. § 119(a) on Patent Application No(s). 092137510 filed in Taiwan, Republic of China on Dec. 30, 2003, the entire contents of which are hereby incorporated by reference.

BACKGROUND OF THE INVENTION

1. Field of Invention

The invention relates to a shielding module and, in particular, to a shielding module, which has a connection component and is used in an electrical apparatus.

2. Related Art

Most of electrical apparatuses work accompanying with electromagnetic radiation, and different electrical apparatuses are always interfered to each other due to the electromagnetic radiation. This is so-called electromagnetic interference (EMI), which may affect other electrical apparatus. More particularly, electrical apparatuses of high sensitive may malfunction, and human body may be injured.

Electromagnetic waves appear as two forms, including irradiation and conduction. When the frequency of an electromagnetic wave is less than 10 MHz, the electromagnetic wave appears as the form of conduction. When the frequency of an electromagnetic wave is greater than 10 MHz, the electromagnetic wave always appears as the form of irradiation. To prevent the radiation and interference of electromagnetic waves, the containers and conducting wires of electrical products should include high-electromagnetic-conducted materials for shielding electromagnetic waves. In such a case, the thickness of a shielding device should be thicker for shielding electromagnetic waves of lower frequency, and that of the shielding device should be thinner for shielding electromagnetic waves of higher frequency.

To reduce the EMI, a conventional electrical apparatus 1, as shown in FIG. 1, provides a shielding cap 12, which is made of an electric-conducted material, on an electrical device 11. The shielding cap 12 has connection pins 121 for assembling with a circuit board 13, so that the electrical device 11 can be contained between the shielding cap 12 and the circuit board 13. The shielding cap 12 is capable of erasing the accumulation of static electricity and absorbing electromagnetic field. Thus, the electromagnetic wave can be shielded, and the EMI is prevented.

Since the present electrical products become more compact and lighter, and the heat generated by electrical devices is increased, the heat density is rapidly increased. The heat of the electrical devices may not be dissipated easily. Therefore, if the heat-dissipating mechanism for the electrical devices is ineffective, the performance and reliability of the electrical product is deathly affected. Moreover, the lifetime of the electrical product is shortened.

Furthermore, the shielding cap of the electrical apparatus may have an opening for providing a heat-dissipating component on the electrical device, so as to achieve the objectives of heat dissipation and EMI prevention. However, since the heat-dissipating component is attached to the electrical device with an adhesive, the heat dissipation rate is poor. Moreover, since the heat-dissipating component is attached and is not replaced easily, the repairing of the electrical device is difficult when the electrical device has defects. In such a case, the whole circuit board may be discarded as junk.

It is therefore a subjective of the invention to provide a shielding module and an electrical apparatus for solving the above-mentioned problems.

SUMMARY OF THE INVENTION

In view of the above, an objective of the invention is to provide a shielding module and an electrical apparatus, which are easily assembled and repaired.

To achieve the above-mentioned objective, the shielding module of the invention used for shielding an electrical device includes a heat-dissipating component, a casing, and a connection component. In the invention, the heat-dissipating component has a contacting portion to contact with the electrical device. The electrical device is located in the casing. The casing has an opening, and the heat-dissipating component is disposed in the opening. The connection component cooperates with the casing to fasten the heat-dissipating component on the electrical device.

Furthermore, the electrical apparatus of the invention includes an electrical device, a heat-dissipating component, a casing and a connection component. The electrical device is mounted on a circuit board. The heat-dissipating component has a contacting portion, which is adjacent to and contacts with the electrical device. The electrical device is located in the casing. The casing has an opening, and the heat-dissipating component is disposed in the opening. The connection component cooperates with the casing to fasten the heat-dissipating component on the electrical device.

As mentioned above, the shielding module and electrical apparatus of the invention utilizes the connection component and the casing with shielding effect to fasten the heat-dissipating component on the electrical device, which generates heat. Compared with the prior art, the invention improves the conventional technology, which uses the adhesive to attach the heat-dissipating component on the electrical device. Therefore, if the electrical device of the invention is malfunction and requires to be repaired, the repairing of the electrical device can be performed with removing the connection between the connection component and the casing. Thus, the heat-dissipating component and electrical device would not be damaged, and the repairing of the electrical apparatus is easy and fast. Moreover, the cost of the discarded electrical device, which is caused by the difficult repairing, is reduced. In addition, the casing of the invention includes at least one partition to form a plurality of containing spaces, which is used to contain various electrical devices. In such a case, the repairing of the electrical device is facile since the casing is unnecessary to be disassembled. Therefore, the time for repairing the electrical device is decreased.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The shielding module and electrical apparatus according to the embodiments of the invention will be described herein below with reference to relevant drawings, wherein the same elements are assigned with the same reference numbers.

Figure 1:
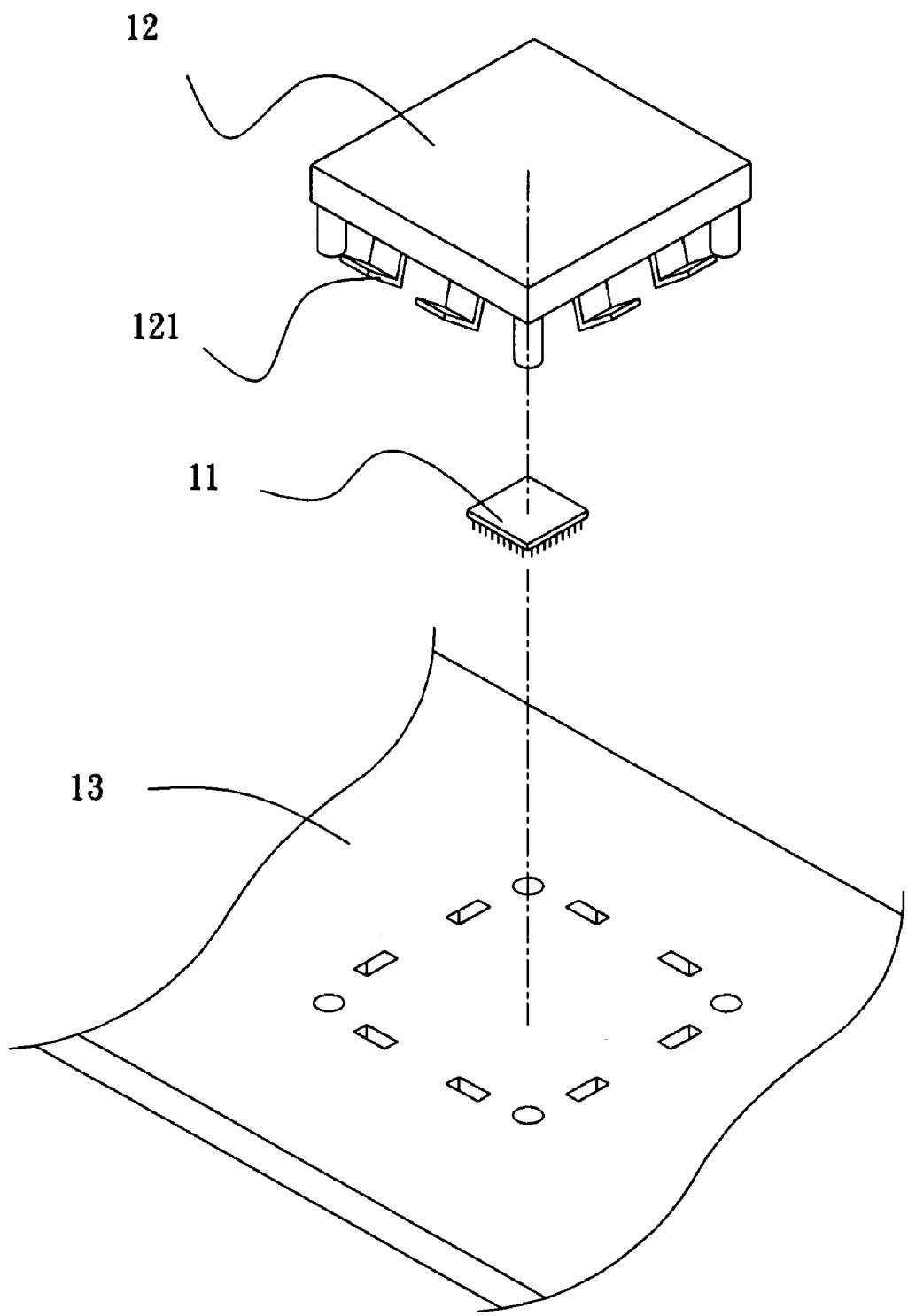
FIG. 1 is a schematic diagram showing a conventional electrical apparatus with a shielding element.
Figure 2:
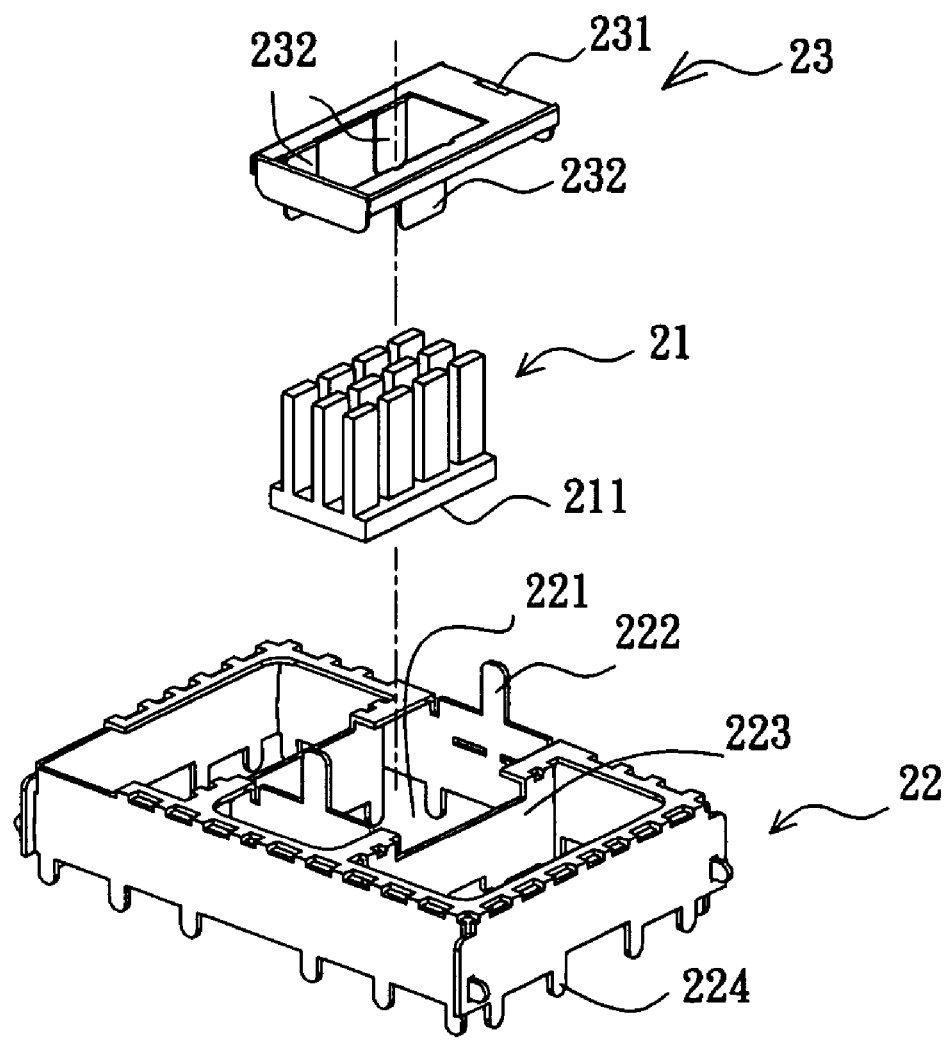
FIG. 2 is an exploded view showing a shielding module according to a preferred embodiment of the invention.

Referring to FIG. 2, a shielding module 2 according to an embodiment of the invention is used for shielding an electrical device. The shielding module 2 includes a heat-dissipating component 21, a casing 22 and a connection component 23.

The heat-dissipating component 21 has a contacting portion 211. In the embodiment, the heat-dissipating component 21 is a heat sink, such as a heat fin. The heat-dissipating component 21 can also be a heat sink of any other shape.

Figure 3:
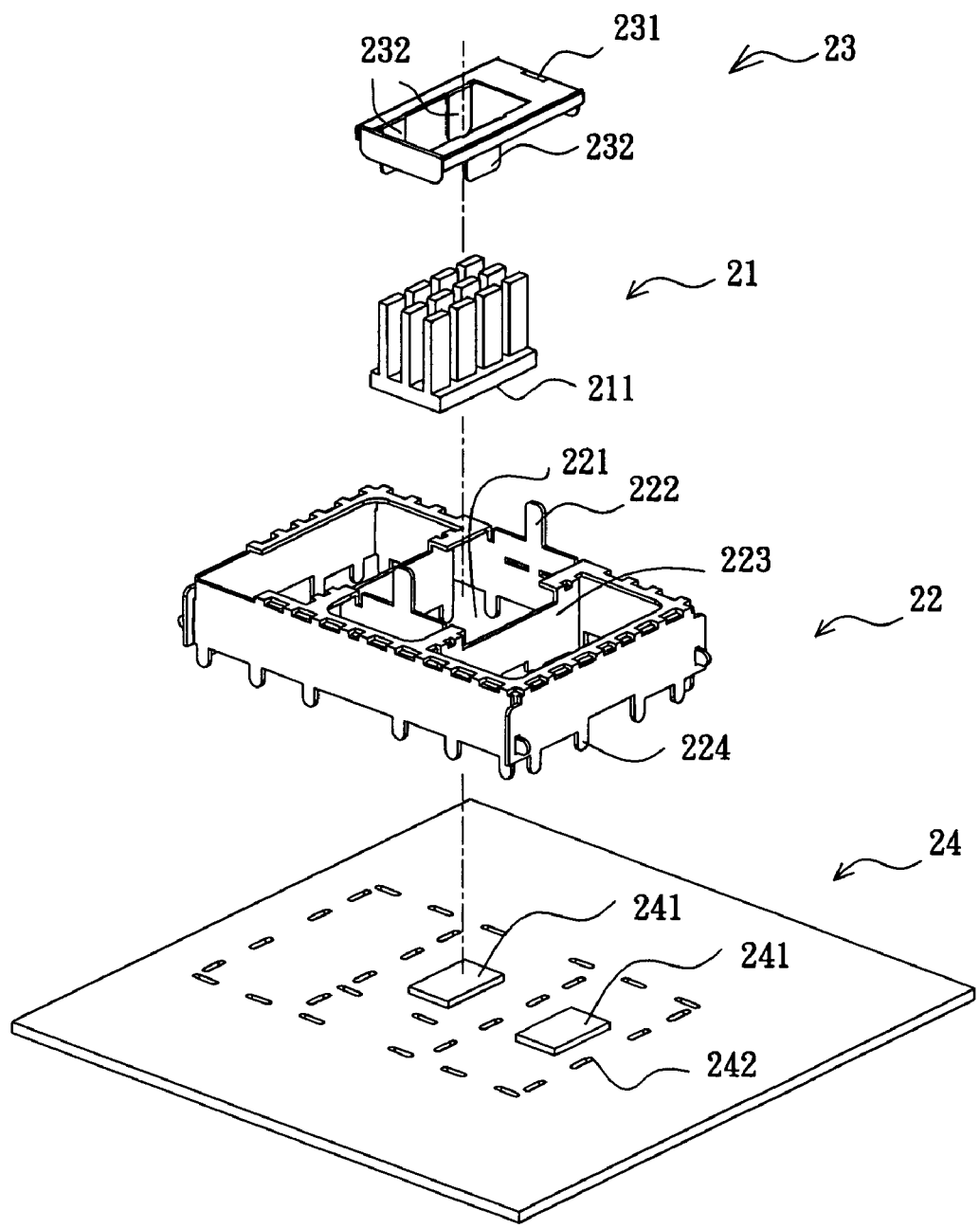
FIG. 3 is an exploded view showing an electrical apparatus according to a preferred embodiment of the invention.

The casing 22 has at least one opening 221 and a first connection portion 222. The heat-dissipating component 21 is positioned in the opening 221, and the first connection portion 222 is connected to the casing 22. In this embodiment, the casing 22 may further include a partition 223, so that the casing 22 may have a plurality of containing spaces to contain various electrical devices 241 (as shown in FIG. 3). Accordingly, the electrical devices 241 could be positioned in different containing spaces. The partition 223 can also shield the EMI. Furthermore, the first connection portion 222 can be formed on the partition 223.

Figure 5:
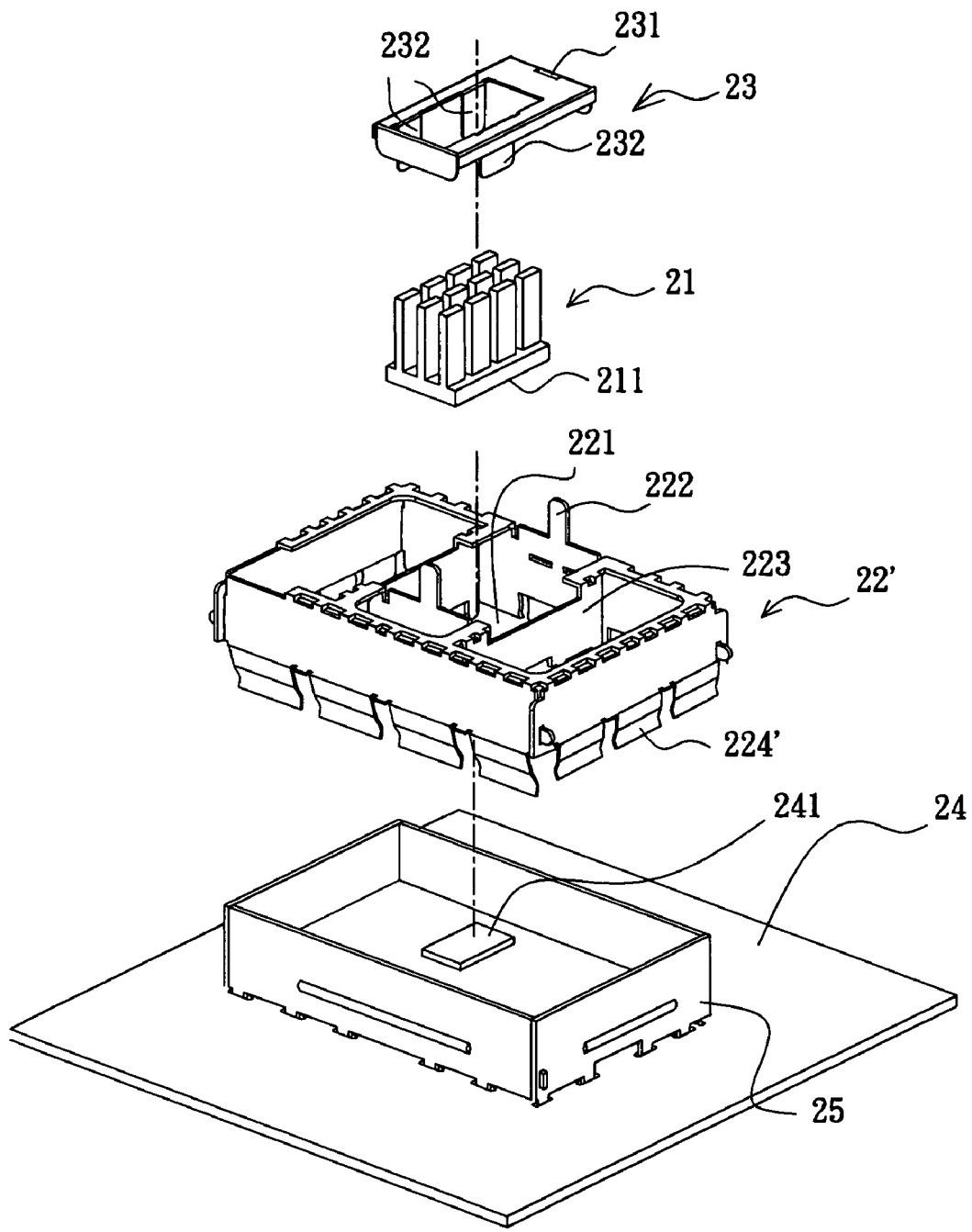
FIG. 5 is an exploded view showing an electrical apparatus according to an additional preferred embodiment of the invention.

With reference to FIG. 3, the casing 22 further has an assembling portion 224 set on another side of the casing 22. In the embodiment, the assembling portion 224 is a protrusion, which is used to assemble the casing 22 on a circuit board 24. Alternatively, the assembling portion 224 can be welded to the circuit board 24. In other words, regarding to the method for assembling the casing 22 and the circuit board 24 with the assembling portion 224, dual in-line package (DIP) technology would be one choice to insert the connection portion 224 into the plugged hole 242. In addition, surface mount technology (SMT) is also a proper choice. In such a case, a welding pad (not shown) is formed on the circuit board 24 in advance, and a layer of tin is then printed on the circuit board 24. The assembling portion 224 of the casing 22 is positioned on the layer of tin. After a reflowing process at a high temperature, the protrusion can be welded and mounted on the circuit board 24. It should be noted that the assembling portion 224 of the casing 22 could be a protrusion of any shape. For example, the assembling portion 224 is a wave-shaped buckling element (as shown in FIG. 5), which is buckled to a basement 25.

Figure 4:
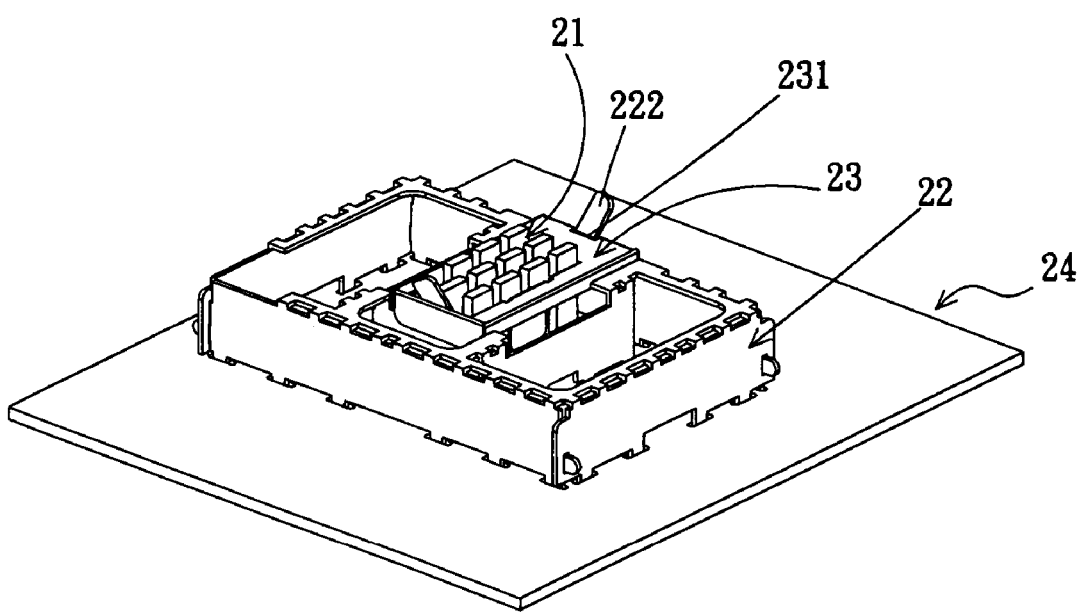
FIG. 4 is a schematic diagram showing an assembled electrical apparatus as shown in FIG. 3.

The connection component 23 has at least one second connection portion 231, which is connected with the first connection portion 222 to fasten the heat-dissipating component 21. Therefore, the contacting portion 211 of the heat-dissipating component 21 contacts with the electrical device 241 (as shown in FIG. 4). Moreover, the connection component 23 may further have at least one fixing portion 232, which is provided at the edge of the connection component 23 and contacts to the heat-dissipating component 21.

The electrical apparatus according to the embodiment of the invention will be described herein below with reference to FIG. 3 and FIG. 4.

Referring to FIG. 3, an electrical apparatus includes a heat-dissipating component 21, a casing 22, a connection component 23, and an electrical device 241. In the embodiment, the heat-dissipating component 21, casing 22 and connection component 23 are similar to those above-mentioned.

The electrical device 241 is mounted on a circuit board 24 and generates heat when it works. The electrical device 241 is, for example, a chip, a thermal ceramic device, or the likes.

In the present embodiment, the first connection portions 222 are buckling strips connecting to the casing 22. The second connection portions 231 are slits located at opposite sides of the connection component 23. The buckling strips go through the slits of the connection component 23, and the buckling strips are then folded downwardly. Accordingly, the heat-dissipating component 21 positioned in the opening 221 can be fastened and contact with the electrical device 241. The first connection portions 222 and second connection portions 231 are not limited within the disclosed buckling strips and slits, and they can be, in contrary, provided as slits and buckling strips.

As mentioned above, when the electrical device 241 requires to be repaired or the heat-dissipating component 21 is necessary to be replaced, the repairing procedure or replacing procedure is very simple. Firstly, the first connection portions 222 are unfolded. Then, the connection component 23 is disassembled, and the heat-dissipating component 21 can be replaced or the electrical device 241 can be removed for repairing.

The casing 22 further has an assembling portion 224 disposed on another side of the casing 22. In this embodiment, the assembling portion 224 is a protrusion, which is used for assembling the casing 22 on a circuit board 24 (as shown in FIG. 3). Alternatively, the assembling-portion 224 can be welded to the circuit board 24. In other words, regarding to the method for assembling the casing 22 and the circuit board 24 with the assembling portion 224, dual in-line package (DIP) technology would be one choice to insert the connection portion 224 into the plugged hole 242. In addition, surface mount technology (SMT) is also a proper choice. In such a case, a welding pad (not shown) is previously formed on the circuit board 24, and a layer of tin is then printed on the circuit board 24. The assembling portion 224 of the casing 22 is positioned on the layer of tin. After a reflowing process at a high temperature, the protrusion can be welded and mounted on the circuit board 24.

The electrical apparatus according to an additional embodiment of the invention will be described herein below with reference to FIG. 5.

With reference to FIG. 5, an electrical apparatus includes a heat-dissipating component 21, a casing 22', a connection component 23, an electrical device 241, and a basement 25. In the current embodiment, the heat-dissipating component 21, connection component 23, and electrical device 241 are similar to those previous-mentioned.

In the embodiment, the circuit board 24 is a printing circuit board (PCB), and the basement 25 is provided on the circuit board 24.

Referring to FIG. 5, the casing 22' has at least one opening 221 and a first connection portion 222. The heat-dissipating component 21 is positioned in the opening 221, and the first connection portion 222 is formed at one side of the casing 22'. In this embodiment, the casing 22' may further include a partition 223, so that the casing 22' may have a plurality of containing spaces to contain various electrical devices 241. Accordingly, the electrical devices 241 could be positioned in different containing spaces. The partition 223 can also shield the EMI. Furthermore, the first connection portion 222 can be formed on the partition 223.

The casing 22' further has an assembling portion 224' formed on an additional side of the casing 22'. In the present embodiment, the assembling portion 224' is a wave-shaped buckling element (as shown in FIG. 5), and is buckled to the basement 25.

The first connection portions 222 are buckling strips connecting to the casing 22'. The second connection portions 231 are slits located at opposite sides of the connection component 23. The buckling strips go through the slits of the connection component 23, and the buckling strips are then folded downwardly. Accordingly, the heat-dissipating component 21 positioned in the opening 221 can be fastened and contact with the electrical device 241. The first connection portions 222 and second connection portions 231 are not limited to the disclosed buckling strips and slits, and they can be, in contrary, provided as slits and buckling strips.

As previously mentioned, when the electrical device 241 requires to be repaired or the heat-dissipating component 21 is necessary to be replaced, the repairing procedure or replacing procedure is very simple. Firstly, the first connection portions 222 are unfolded. Then, the connection component 23 is disassembled, so that the heat-dissipating component 21 can be replaced or the electrical device 241 can be removed for repairing.

In summary, the shielding module and electrical apparatus of the invention utilizes the connection component and the casing with shielding effect to fasten the heat-dissipating component on the electrical device, which generates heat. Compared with the prior art, the invention improves the conventional technology, which uses the adhesive to attach the heat-dissipating component on the electrical device. Therefore, if the electrical device of the invention is malfunction and requires to be repaired, the repairing procedure of the electrical device can be performed with removing the connection between the connection component and the casing. Thus, the heat-dissipating component and electrical device would not be damaged, and the repairing procedure of the electrical apparatus is easy and fast. Moreover, the cost of the discarded electrical device, which is caused by the difficult repairing, is reduced. In addition, the casing of the invention includes at least one partition to form a plurality of containing spaces, which is used to contain various electrical devices. In such a case, the repairing procedure of the electrical device is facile since the casing is unnecessary to be disassembled. Therefore, the time for repairing the electrical device is shortened.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A shielding module, which is for shielding an electrical device, comprising:
   a heat-dissipating component, which has a contacting portion to contact with the electrical device;
   a casing, which has an opening, at least one partition and a buckling strip, wherein the electrical device is located in the casing, and the heat-dissipating component is disposed in the opening, the partition forms a plurality of containing spaces, the buckling strip connects to the casing; and
   a connection frame, which cooperates with the casing to fasten the heat-dissipating component on the electrical device, the connection frame having an opening and a slit, wherein one part of the heat-dissipating component goes through the opening of the connection frame, the buckling strip goes through the slit of the connection frame, the buckling strip and the slip of the connection frame fasten the heat-dissipating component on the electrical device.

2. The shielding module of claim 1, wherein the connection frame further has at least one fixing portion, and the fixing portion contacts with the heat-dissipating component.

3. The shielding module of claim 1, wherein the buckling strip connects to the casing, and the buckling strip goes through the slit of the connection frame.

4. The shielding module of claim 1, wherein the heat-dissipating component is a heat sink.

5. The shielding module of claim 1, wherein the connection frame is mounted on the casing.

6. The shielding module of claim 1, wherein the casing further has an assembling portion disposed on one side of the casing, the assembling portion is a protrusion for assembling the casing on a circuit board, and the protrusion is welded to the circuit board.

7. The shielding module of claim 6, wherein the assembling portion is buckled to a basement, the basement is mounted on the circuit board, the casing is positioned around the basement, and the assembling portion is a wave-shaped buckling element.

8. An electrical apparatus, comprising:
   an electrical device, which is mounted on a circuit board;
   a heat-dissipating component, which has a contacting portion adjacent to and contacting with the electrical device;
   a casing, which has an opening, at least one partition and a buckling strip, wherein the electrical device is located in the casing, and the heat-dissipating component is disposed in the opening, the partition forms a plurality of containing spaces, the buckling strip connects to the casing; and
   a connection frame, which cooperates with the casing to fasten the heat-dissipating component on the electrical device, the connection frame having an opening and a slit, wherein one part of the heat-dissipating component goes through the opening of the connection frame, the buckling strip goes through the slit of the connection frame, the buckling strip and the slip of the connection frame fasten the heat-dissipating component on the electrical device.

9. The electrical apparatus of claim 8, wherein the connection frame further has at least one fixing portion, and the fixing portion contacts with the heat-dissipating component.

10. The electrical apparatus of claim 8, wherein the buckling strip connects to the casing, and the buckling strip goes through the slit of the connection frame.

11. The electrical apparatus of claim 8, wherein the heat-dissipating component is a heat sink.

12. The electrical apparatus of claim 8, wherein the connection frame is mounted on the casing.

13. The electrical apparatus of claim 8, wherein the casing further has an assembling portion disposed on one side of the casing, the assembling portion is a protrusion for assembling the casing on a circuit board, and the protrusion is welded to the circuit board.

14. The electrical apparatus of claim 13, wherein the electrical apparatus further comprises a basement, the basement is mounted on the circuit board, the casing is positioned around the basement, and the assembling portion is a wave-shaped buckling element.

* * * * *